(12) United States Patent
Kang et al.

(10) Patent No.: US 12,557,218 B2
(45) Date of Patent: Feb. 17, 2026

(54) THREE-DIMENSIONAL WIRED CIRCUIT BOARD STRUCTURE

(71) Applicant: Guangzhou Kanglong Electronics Co., Ltd., Guangzhou (CN)

(72) Inventors: Tielong Kang, Guangzhou (CN); Zhiming Liang, Guangzhou (CN)

(73) Assignee: Guangzhou Kanglong Electronics Co., Ltd., Guangzhou (CN)

( * ) Notice: Subject to any disclaimer, the term of this patent is extended or adjusted under 35 U.S.C. 154(b) by 212 days.

(21) Appl. No.: 18/573,983

(22) PCT Filed: Jun. 22, 2022

(86) PCT No.: PCT/CN2022/100574
§ 371 (c)(1),
(2) Date: Dec. 22, 2023

(87) PCT Pub. No.: WO2022/268140
PCT Pub. Date: Dec. 29, 2022

(65) Prior Publication Data
US 2024/0292538 A1    Aug. 29, 2024

(30) Foreign Application Priority Data

Jun. 24, 2021 (CN) .......................... 202110708272.7
Jun. 24, 2021 (CN) .......................... 202121433593.2

(51) Int. Cl.
*H05K 1/14* (2006.01)
*H05K 1/11* (2006.01)

(52) U.S. Cl.
CPC .............. *H05K 1/14* (2013.01); *H05K 1/117* (2013.01); *H05K 2201/09172* (2013.01); *H05K 2201/094* (2013.01)

(58) Field of Classification Search
CPC .................. H05K 1/14; H05K 1/117; H05K 2201/09172; H05K 2201/094
(Continued)

(56) References Cited

U.S. PATENT DOCUMENTS

| | | | |
|---|---|---|---|
| 7,435,095 B1 * | 10/2008 | Yi | ........................ H01R 12/718 439/61 |
| 2016/0006150 A1 * | 1/2016 | Bachmutsky | ........ H01R 12/737 439/65 |
| 2019/0037689 A1 | 1/2019 | Du et al. | |

FOREIGN PATENT DOCUMENTS

| | | |
|---|---|---|
| CN | 101984599 A | 3/2011 |
| CN | 102890665 A | 1/2013 |

(Continued)

OTHER PUBLICATIONS

English Translation of PCT Int. Search Report, Int. Application No. PCT/CN2022/100574, Int. Filing Date: Jun. 22, 2022, Date of Mailing: Aug. 30, 2022.

*Primary Examiner* — Binh B Tran
(74) *Attorney, Agent, or Firm* — Reising Ethington P.C.

(57) ABSTRACT

The present disclosure is a three-dimensional wired circuit board structure, including a bottom board, the bottom board having a first slot and a first pin thereon; a function board, the function board having a second pin and a third pin thereon; and a bridge board, the bridge board having a second slot and a fourth pin thereon. The bottom of the function board is inserted into the second slot and the second pin is connected to the fourth pin, so as to form a combined function module. The combined function module is inserted into the first slot, and the third pin is connected to the first pin.

12 Claims, 4 Drawing Sheets

(58) Field of Classification Search
USPC .......................................................... 361/785
See application file for complete search history.

(56) References Cited

FOREIGN PATENT DOCUMENTS

| | | |
|---|---|---|
| CN | 204994085 U | 1/2016 |
| CN | 208540244 U | 2/2019 |
| CN | 109964543 A | 7/2019 |
| CN | 210016722 U | 2/2020 |
| CN | 113423171 A | 9/2021 |
| CN | 216057630 U | 3/2022 |

* cited by examiner

THREE-DIMENSIONAL WIRED CIRCUIT BOARD STRUCTURE

CROSS-REFERENCE TO RELATED APPLICATION

This patent application is a national stage application of International Patent Application No. PCT/CN2022/100574, filed on Jun. 22, 2022, which claims the benefit and priority of Chinese Patent Application No. 202121433593.2 and 202110708272.7, filed with the China National Intellectual Property Administration on Jun. 24, 2021, the disclosure of which is incorporated by reference herein in its entirety as part of the present application.

TECHNICAL FIELD

The present disclosure relates to the technical field of circuit boards, and in particular to a three-dimensional wired circuit board structure.

BACKGROUND

One-dimensional circuit board structure is that related circuit design is conducted only on one circuit board, and two-dimensional circuit board structure is that a circuit bottom board is provided, and then multiple function module boards are vertically inserted into the circuit bottom board.

At present, in the market, the circuit board structure is limited to one-dimensional or two-dimensional structure, that is, the circuit is designed only on one circuit board, or a bottom board/multiple functional boards are provided, and then the function boards are inserted vertically into the bottom board, so the layout area and circuit wiring density of an electronic device are limited by a certain degree of space. In particular, at the era of the rise of the Internet of Things, the Internet of Things is booming in various fields, and the era of the Internet of Everything is gradually approaching. The devices of Internet of Things tend to be smaller, more complicated and more flexible.

However, in the process of implementing the prior art, the inventors of the present application found that there are at least the following technical problems in the prior art:

In the two-dimensional circuit board structure in the prior art, the number of lead-out pins of the function module is affected in a case of limited function module caused by less connecting pins between the function module board and the bottom board.

SUMMARY

In order to solve the problems above, an objective of the present disclosure is to provide a three-dimensional wired circuit board structure to solve the technical problem that the number of lead-out pins of a function module is affected in a case that the function module is limited due to less connecting pin between the function module board and the bottom board in the existing two-dimensional circuit board structure in the prior art.

In order to solve the technical problem above, an embodiment of the present disclosure employs the following technical solution:

A three-dimensional wired circuit board structure is provided by an embodiment of the present disclosure. The three-dimensional wired circuit board structure includes a bottom board, having a first slot and a first pin thereon; a function board, having a second pin and a third pin thereon; and a bridge board, having a second slot and a fourth pin thereon. The bottom of the function board is inserted into the second slot, and the second pin is connected to the fourth pin, so as to form a combined function module. The combined function module is inserted into the first slot, and the third pin is connected to the first pin.

Further, at least two function boards are provided. The number of the first slots and the number of the second slots are consistent with the number of the function boards. The at least two function boards are respectively inserted into the corresponding second slots to form the combined function modules. The combined function modules are respectively inserted into the corresponding first slots.

Further, the second pin is located above the third pin, when the function board is inserted into the second slot, a position the second pin corresponds to that of the fourth pin, and the second pin is connected to the fourth pin by welding.

Further, in the combined function module, the function board penetrates into the second slot, and the third pin is located below the second slot. When the combined function module is inserted into the first slot, a position of the third pin corresponds to that of the first pin, and the third pin is connected to the first pin by welding.

Further, the bottom board is provided with at least one function zone, and each function zone is provided with the first slot and the first pin.

Further, the bottom of the function board is provided with a first protrusion and a second protrusion, and a groove is provided between the first protrusion and the second protrusion. The first slot includes a first sub-slot and a second sub-slot, and a first connecting portion is provided between the first sub-slot and the second sub-slot. When the combined function module is inserted into the first slot, the first protrusion is inserted into the first sub-slot, the second protrusion is inserted into the second sub-slot, and the first connecting portion is located in the groove.

Further, at least two first pins are provided, which are arranged around the first slot. At least two second pins are provided, which are transversely arranged on a front face and/or back face of the function board. At least two third pins are provided, which are transversely arranged on the front face and/or back face of the function board. At least two fourth pins are provided, which are arranged around the second slot.

Further, the bottom of the function board is inserted into the second slot, and the function board and the bridge board are arranged perpendicular or oblique to each other.

Further, the second slot includes a third sub-slot and a fourth sub-slot, and a second connecting portion is provided between the third sub-slot and the fourth sub-slot. The first protrusion penetrates through the third sub-slot, and the second protrusion penetrates through the fourth sub-slot. The second connecting portion is located in the groove.

Further, the bottom of the function board is further provided with a third protrusion, and the third protrusion is located between the first protrusion and the second protrusion. The bridge board is provided with a third slot, and the third slot is located between the third sub-slot and the fourth sub-slot. In the combined function module, the third protrusion penetrates through the third slot to form inter-board distance between the bridge board and the bottom board, and the inter-board distance makes the third pin flush with the first pin.

Further, the third slot is provided as a through hole.

Further, the third protrusion is used to separate the bridge board from the bottom board.

Further, after the combined function module is inserted into the first slot, the bridge board and the bottom board are kept parallel.

Compared with the prior art, the embodiments of the present disclosure have beneficial effects that:

A three-dimensional wired circuit board structure provided by an embodiment of the present disclosure includes a bottom board, having a first slot and a first pin thereon; a function board, having a second pin and a third pin thereon; and a bridge board, having a second slot and a fourth pin thereon. The bottom of the function board is inserted into the second slot and the second pin is connected to the fourth pin, so as to form a combined function module. The combined function module is inserted into the first slot, and the third pin is connected to the first pin. Forming a combined function module by means of a bridge board and a function board and arranging the combined function module on a bottom board not only improve the space utilization efficiency and increase connection pins of the bottom board to the function board, but also increase a circuit wiring space of the function board and layout area of an electronic device. Therefore, the technical problem that the number of lead-out pins of a function module is affected in a case that the function module is limited due to less connecting pin between the function module board and the bottom board in the existing two-dimensional circuit board structure in the prior art is effectively solved.

BRIEF DESCRIPTION OF THE DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and those of ordinary skill in the art may still derive other drawings from these accompanying drawings without creative efforts.

In the drawings.

100—bottom board; 101—first sub-slot; 102—second sub-slot; 103—third slot; 114—first slot; 104—first pin; 200—function board; 201—second pin; 202—third pin; 203—first protrusion; 204—second protrusion; 205—third protrusion; 300—bridge board; 301—third sub-slot; 302—fourth sub-slot; 303—third slot; 304—fourth pin; 310—second slot; 400—combined function module.

DETAILED DESCRIPTION OF THE EMBODIMENTS

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

In the description of the embodiments of the present disclosure, it needs to be understood that the orientation or positional relationship indicated by terms "center", "top", "bottom", "left", "right", "vertical", "horizontal", "inside" and "outside" is based on the orientation or positional relationship shown in the drawings only for convenience of description of the present disclosure and simplification of description rather than indicating or implying that the device or element referred to must have a particular orientation, be constructed and operate in a particular orientation, and thus are not to be construed as limiting the present disclosure. In addition, the terms "first" and "second" are used for descriptive purposes only and are not to be construed as indicating or implying relative importance.

In the description of the embodiments of the present disclosure, unless expressly specified and limited otherwise, the terms "install", "connect", "couple" and the like should be understood broadly, e.g., may be either a fixed connection or a replaceable connection, or a connection in one piece; may be a mechanical connection or an electrical connection; may be a direct connection or an indirect connection through an intermediate medium, may be an internal communication between the two elements or interactions between the two elements. For those of ordinary skill in the art, the specific meanings of the above terms in the utility model can be understood on a case-by-case basis.

The following further describes the specific embodiments of the present disclosure in detail in conjunction with the accompanying drawings and embodiments. The following embodiments are used to illustrate the present disclosure, but are not intended to limit the scope of the present disclosure.

As shown in FIG. 1 to FIG. 5, a three-dimensional wired circuit board structure is provided by an embodiment of the present disclosure.

The three-dimensional wired circuit board structure includes:
- a bottom board 100, having a first slot 114 and a first pin 104 thereon,
  - where multiple first pins 104 are provided, which are arranged around the first slot 114.
- A function board 200, having a second pin 201 and a third pin 202 thereon,
  - where multiple second pins 201 are provided, which are transversely arranged on a front face and a back face of the function board 200; and
  - multiple third pins 202 are provided, which are transversely arranged on the front face and the back face of the function board 200.
- A bridge board 300, having a second slot 310 and a fourth pin 304 thereon, that is, the fourth pin 304 and the second slot 310 form the bridge board 300,
  - where multiple fourth pins 304 are provided, which are arranged around the second slot 310.

The bottom of the function board 200 is inserted into the second slot 310, and the second pin 201 is connected to the fourth pin 304, so as to form a combined function module 400. The second slot 310 is composed of a third sub-slot 301, a fourth sub-slot 302 and a third sub-slot 303.

Figure 1:
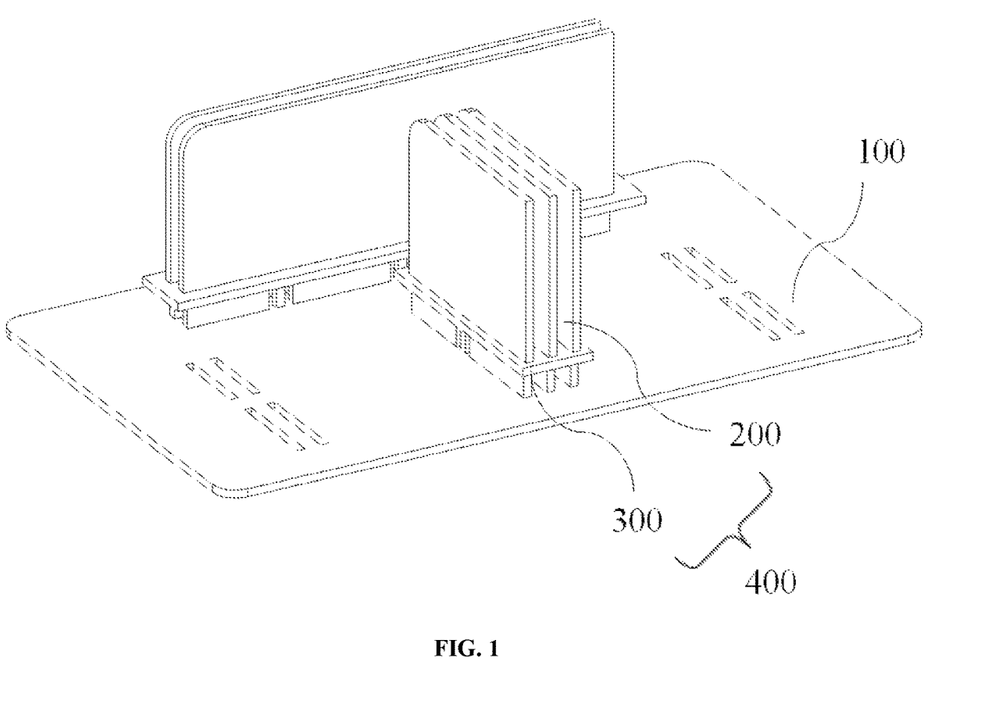
FIG. 1 is a structural schematic diagram of a three-dimensional wired circuit board structure according to an embodiment.
Figure 2:
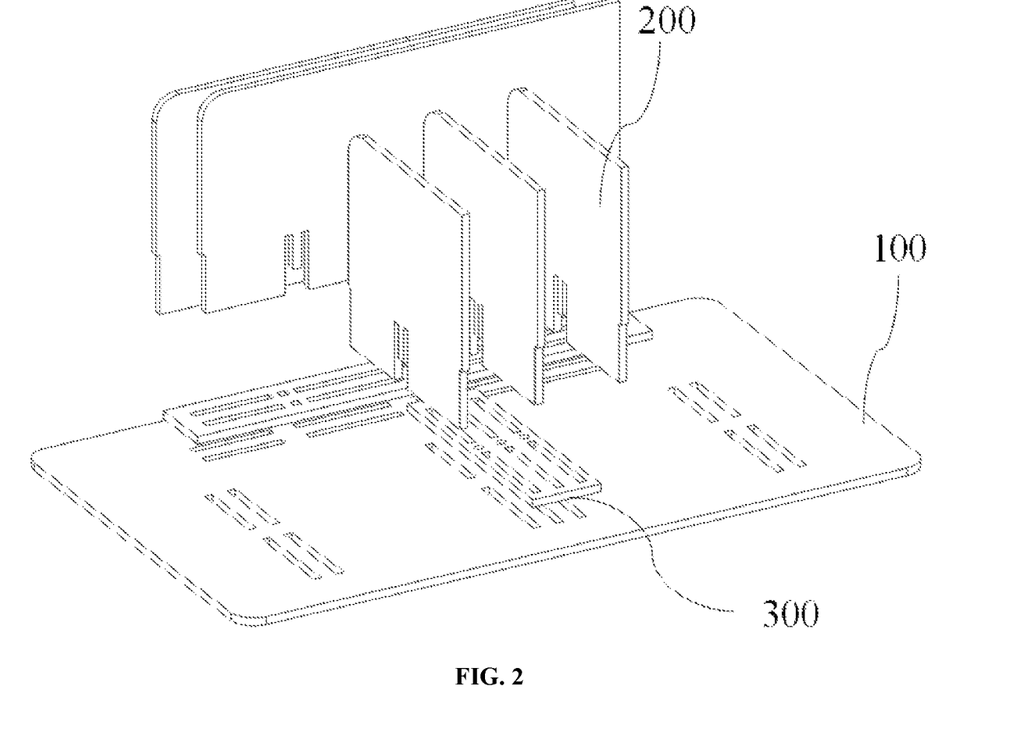
FIG. 2 is an exploded view of a three-dimensional wired circuit board structure according to an embodiment.
Figure 3:
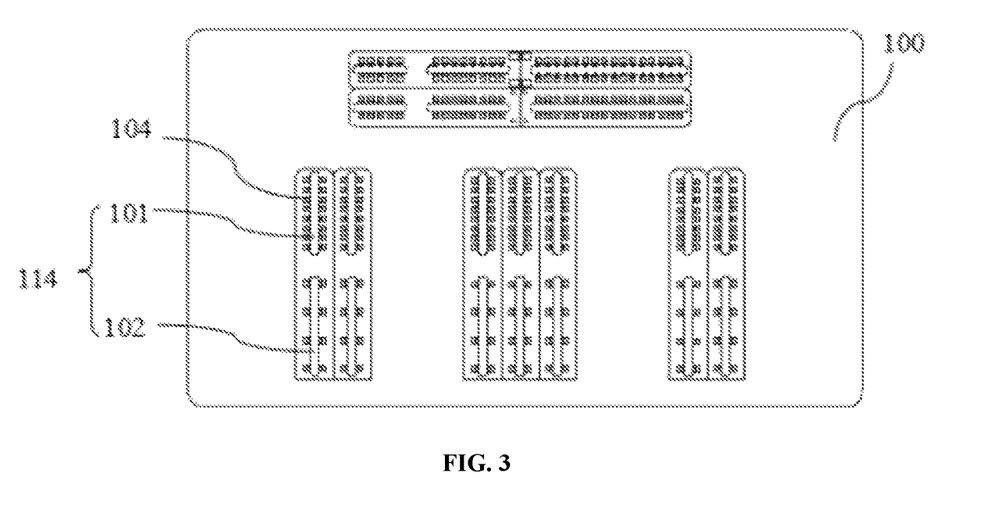
FIG. 3 is a structural schematic diagram of a bottom board of a three-dimensional wired circuit board structure according to an embodiment.

The combined function module 400 is inserted into the first slot 114, and the third pin 202 is connected to the first pin 104.

The second pin 201 is connected to the fourth pin 304 by welding, so as to form the combined function module 400 by the function board 200 and the bridge board 300.

When the combined function module 400 is inserted into the first slot 114, that is, when the bottom of the function module is inserted into the first slot 114, the bridge board 300 is parallel to the bottom board 100, which not only improves the space utilization rate and increases connecting pins of the bottom board 100 to the function board 200, but also increases the circuit wiring space of the function board and layout area of an electronic device. Therefore, the technical problem that the number of lead-out pins of a function module is affected in a case that the function module is limited due to less connecting pin between the function module board and the bottom board in the existing two-dimensional circuit board structure in the prior art is effectively solved.

Further, there are at least two function boards 200.

The number of the first slots 114 and the number of the second slots 310 are consistent with the number of the function boards 200.

The at least two function boards 200 are respectively inserted into the corresponding second slots 310 to form the combined function modules 400.

The combined function modules 400 are respectively inserted into the corresponding first slots 114.

There are at least two function boards 200. One function board 200 corresponds to one first slot 114, at least two function boards 300 are inserted into the second slots 310 on the bridge board 300, such that the layout wiring space of the combined function module 400 is increased when the number of pins of the combined function module 400 is increased.

Figure 5:
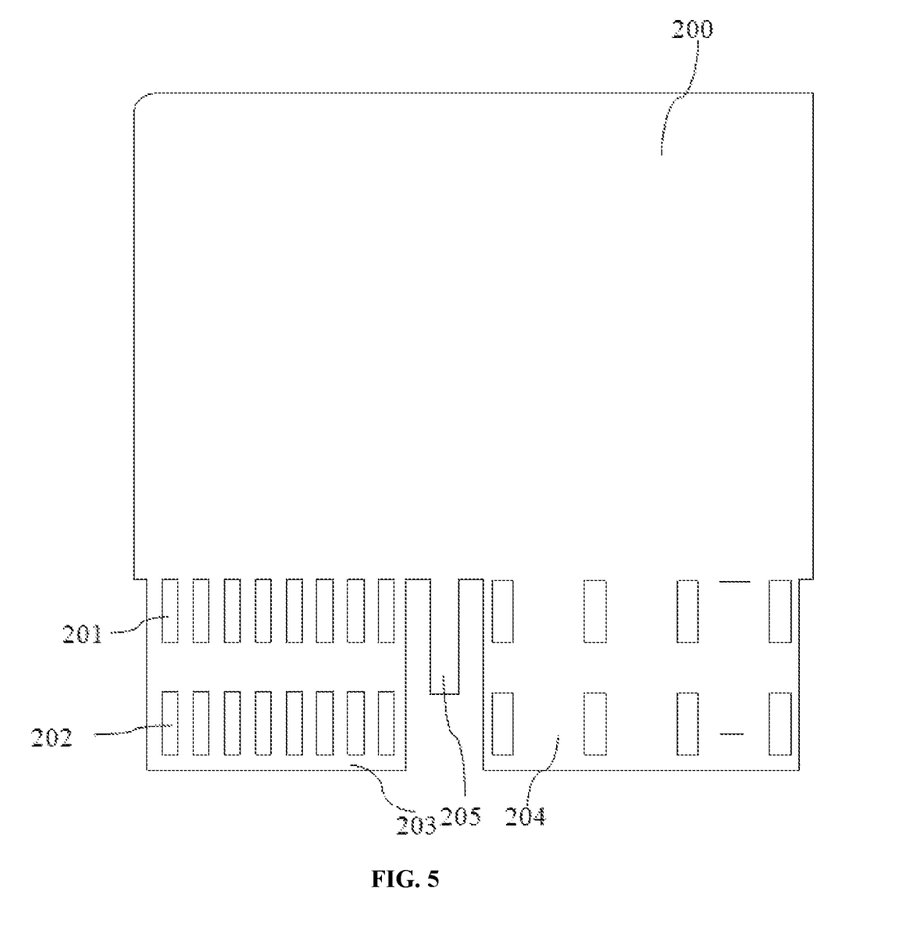
FIG. 5 is a structural schematic diagram of a function board of a three-dimensional wired circuit board structure according to an embodiment.

Specifically, in order to facilitate the connection between the function board 200 and the bridge board 300, the second pin 201 is located above the third pin 202.

Figure 4:
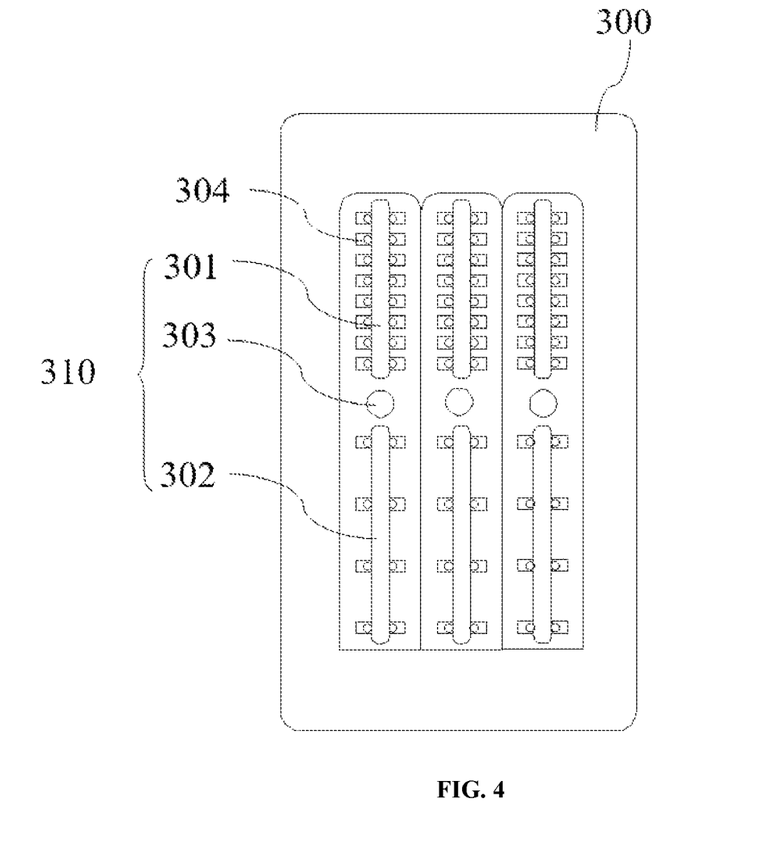
FIG. 4 is a structural schematic diagram of a bridge board of a three-dimensional wired circuit board structure according to an embodiment.

When the function board 200 is inserted into the second slot 310, a position of the second pin 201 corresponds to that of the fourth pin 304, the second pin 201 is connected to the fourth pin 304 by welding.

Further, in order to facilitate the welding between the function board 200 and the bottom board 100, in the combined function module 400, the function board 200 penetrates into the second slot 310, and the third pin 202 is located below the second slot 310.

When the combined function module 400 is inserted into the first slot 114, a position of the third pin 202 corresponds to that of the first pin 104, and the third pin 202 is connected to the first pin 104 by welding.

Further, in order to improve the expansion function and wiring effect of the bottom board 100, the bottom board 100 is provided with at least one function zone, and each function zone is provided with the first slot 114 and the first pin 104.

Further, in order to facilitate the insertion of the function board 200 into the bridge board 300 and the bottom board 100, the bottom of the function board 200 is provided with a first protrusion 203 and a second protrusion 204, and a groove is provided between the first protrusion 203 and the second protrusion 204. The first slot 114 includes a first sub-slot 101 and a second sub-slot 102, and a first connecting portion is provided between the first sub-slot 101 and the second sub-slot 102. Referring to FIG. 3, there is a part of the bottom board region without opening treatment between the first sub-slot 101 and the second sub-slot 102, which is the first connecting portion. The first sub-slot 101 and the second sub-slot 102 are located on the same functional board region through the first connecting portion.

When the combined function module 400 is inserted into the first slot 114, the first protrusion 203 is inserted into the first sub-slot 101, the second protrusion 204 is inserted into the second sub-slot 102, and the first connection portion is located in the groove, that is, the position of the first connection portion is in fit with the groove after the two protrusions are inserted into corresponding sub-slots.

By inserting the first protrusion 203 and the second protrusion 204 into the corresponding first sub-slot 101 and second sub-slot 102, the function board 200 and the bridge board 300 are fixed by the structure above. Moreover, the position of the second pin 201 is enabled to correspond to that of the fourth pin 304 by welding. Moreover, by means of welding, the problem of easy desoldering caused by pure welding fixation is avoided.

Further, at least two first pins 104 are provided, which are arranged around the first slot 114.

At least two second pins 201 are provided, which are transversely arranged on the front face and/or back face of the function board 200.

At least two third pins 202 are provided, which are transversely arranged on the front face and/or back face of the function board 200.

At least two fourth pins 304 are provided, which are arranged around the second slot 310.

The first pin 104, the second pin 201, the third pin 202 and the fourth pin 304 are provided to facilitate the welding between the first pin 104 and the third pin 202, and the welding between the second pin 201 and the fourth pin 304.

Further, the bottom of the function board 200 is inserted into the second slot 310, and the function board 200 and the bridge board 300 are arranged perpendicular to or oblique to each other.

When the function board 200 and the bridge board 300 are welded perpendicular to each other, welding legs of the function board 200 and the bridge board 300 can be doubled in a vertical direction and multiplied in a horizontal direction. While the welding legs are expanded by n times in the horizontal direction, the layout and wiring space of the combined function module 400 is also expanded by n times, the number of the welding legs of the function board 200 to the bridge board 300/the layout and wiring space of the function module are no longer limited by the size of the function module, and meanwhile, the vertical space is fully utilized.

Further, the second slot 310 includes a third sub-slot 301 and a fourth sub-slot 302, and a second connecting portion is provided between the third sub-slot 301 and the fourth sub-slot 302.

The first protrusion 203 penetrates through the third sub-slot 301, and the second protrusion penetrates through the fourth sub-slot 302.

The second connecting portion is located in the groove.

By means of the third sub-slot 301, the fourth sub-slot 302 and the second connecting portion, the bottom of the function board 200 in the combined function module can be inserted into the bottom board 100 for physical fixation, so as to weld the second pin 201 and the fourth pin 304, and prevent the problem of easy desoldering caused by pure welding fixation.

Further, the bottom of the function board 200 is also provided with a third protrusion 205, the third protrusion 205 is located between the first protrusion 203 and the second protrusion 204, e.g., located in the groove between the first protrusion 203 and the second protrusion 204.

The bridge board 300 is provided with a third slot 303, the third slot 303 is located between the third sub-slot 301 and the fourth sub-slot 302. The third slot is provided as a through hole.

In the combined function module 400, the third protrusion 205 penetrates through the third slot 303. Illustratively, the third protrusion 205 penetrates through the through hole.

The third protrusion is used for the setting of a certain plate interval, so as to separate the bridge board from the bottom board.

The third protrusion penetrates through the third slot 303 and acts on the bottom board to erect the combined function module, such that there is a certain inter-board distance between the bridge board and the bottom board. This distance can make the third pin 202 flush with the first pin 104 to facilitate the welding. Illustratively, the third slot may be provided as a through hole for positioning and running through the bottom plate. After the third protrusion penetrates through the through hole, the bottom of the third protrusion acts on the bottom board, and thus the combined function module can be positioned on the bottom board. After the combined function module is positioned on the bottom board, the bridge board and the bottom board are parallel to each other and have fixed inter-board distance therebetween. The inter-board distance enables the third pin to be flush with the first pin, so as to achieve rapid and effective welding.

Further, after the third slot is provided as the through hole, the cross-sectional shape of the through hole may be round, elliptic, etc.

As the first protrusion 203, the second protrusion 204 and the third protrusion 205 correspond to the first sub-slot 101, the second sub-slot 102, and the third sub-slot 301, the fourth sub-slot 302 and the third slot 303, respectively, the function board 202 can be effectively fixed to the bridge board 300 and the bottom board 100, and then the pins are welded, thus effectively avoiding the problem of fake-welding and desoldering.

Above embodiments are only used to illustrate the technical solution of the present disclosure rather than limiting. Although the present disclosure has been described in detail with reference to the foregoing embodiments, those of ordinary skill in the art should understand that it is still possible to modify the technical solution described in the foregoing embodiments, or to replace some technical features with equivalents. However, these modifications or substitutions do not make the essence of the corresponding technical solutions deviate from the spirit and scope of the technical solutions of various embodiments of the present disclosure.

The invention claimed is:

1. A three-dimensional wired circuit board structure, comprising:
    a bottom board, having a first slot and a first pin thereon;
    a function board, having a second pin and a third pin thereon; and
    a bridge board, having a second slot and a fourth pin thereon;
    wherein the bottom of the function board is inserted into the second slot, and the second pin is connected to the fourth pin, so as to form a combined function module;
    the combined function module is inserted into the first slot, and the third pin is connected to the first pin;
    wherein the second pin is located above the third pin;
    when the function board is inserted into the second slot, a position of the second pin corresponds to that of the fourth pin, and the second pin is connected to the fourth pin by welding.

2. The three-dimensional wired circuit board structure according to claim 1, wherein at least two function boards are provided;
    the number of the first slots and the number of the second slots are consistent with the number of the function boards;
    the at least two function boards are respectively inserted into the corresponding second slots to form the combined function modules; and
    the combined function modules are respectively inserted into the corresponding first slots.

3. The three-dimensional wired circuit board structure according to claim 1, wherein in the combined function module, the function board penetrates into the second slot, and the third pin is located below the second slot; when the combined function module is inserted into the first slot, a position of the third pin corresponds to that of the first pin, and the third pin is connected to the first pin by welding.

4. The three-dimensional wired circuit board structure according to claim 3, wherein the bottom board is provided with at least one function zone, and each function zone is provided with the first slot and the first pin.

5. The three-dimensional wired circuit board structure according to claim 3, wherein the bottom of the function board is provided with a first protrusion and a second protrusion, a groove is provided between the first protrusion and the second protrusion, the first slot comprises a first sub-slot and a second sub-slot, and a first connecting portion is provided between the first sub-slot and the second sub-slot;
    when the combined function module is inserted into the first slot, the first protrusion is inserted into the first sub-slot, the second protrusion is inserted into the second sub-slot, and the first connecting portion is located in the groove.

6. The three-dimensional wired circuit board structure according to claim 5, wherein the second slot comprises a third sub-slot and a fourth sub-slot, and a second connecting portion is provided between the third sub-slot and the fourth sub-slot;
    the first protrusion penetrates through the third sub-slot, and the second protrusion penetrates through the fourth sub-slot; and
    the second connecting portion is located in the groove.

7. The three-dimensional wired circuit board structure according to claim 6, wherein the bottom of the function board is further provided with a third protrusion, and the third protrusion is located between the first protrusion and the second protrusion;
    the bridge board is provided with a third slot, and the third slot is located between the third sub-slot and the fourth sub-slot;
    in the combined function module, the third protrusion penetrates through the third slot to form inter-board distance between the bridge board and the bottom board, and the inter-board distance makes the third pin flush with the first pin.

8. The three-dimensional wired circuit board structure according to claim 7, wherein the third slot is provided as a through hole.

9. The three-dimensional wired circuit board structure according to claim 7, wherein the third protrusion is used to separate the bridge board from the bottom board.

10. The three-dimensional wired circuit board structure according to claim 1, wherein at least two first pins are provided, which are arranged around the first slot;
- at least two second pins are provided, which are transversely arranged on a front face and/or back face of the function board;
- at least two third pins are provided, which are transversely arranged on the front face and/or back face of the function board; and
- at least two fourth pins are provided, which are arranged around the second slot.

11. The three-dimensional wired circuit board structure according to claim 10, wherein the bottom of the function board is inserted into the second slot, and the function board and the bridge board are arranged perpendicular or oblique to each other.

12. The three-dimensional wired circuit board structure according to claim 1, wherein after the combined function module is inserted into the first slot, the bridge board and the bottom board are kept parallel.

\* \* \* \* \*